United States Patent
Kanbe et al.

(10) Patent No.: US 8,587,271 B2
(45) Date of Patent: Nov. 19, 2013

(54) ENVELOPE TRACKING POWER SUPPLY CIRCUIT AND HIGH-FREQUENCY AMPLIFIER INCLUDING ENVELOPE TRACKING POWER SUPPLY CIRCUIT

(75) Inventors: Akihiro Kanbe, Kiryu (JP); Masato Kaneta, Kiryu (JP); Haruo Kobayashi, Kiryu (JP); Hitoshi Hirata, Osaka (JP); Tatsuhiro Shimura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 420 days.

(21) Appl. No.: 12/866,676

(22) PCT Filed: Feb. 3, 2009

(86) PCT No.: PCT/JP2009/051771
§ 371 (c)(1),
(2), (4) Date: Oct. 26, 2010

(87) PCT Pub. No.: WO2009/099056
PCT Pub. Date: Aug. 13, 2009

(65) Prior Publication Data
US 2011/0031953 A1    Feb. 10, 2011

(30) Foreign Application Priority Data

Feb. 8, 2008  (JP) .............................. P2008-029333

(51) Int. Cl.
*G05F 1/00*    (2006.01)
(52) U.S. Cl.
USPC .......................................... 323/272; 323/284
(58) Field of Classification Search
USPC .................... 323/268, 271, 272, 284
See application file for complete search history.

(56) References Cited

U.S. PATENT DOCUMENTS 5,166,550 A * 11/1992 Matsubara et al. ............. 327/68
5,905,407 A    5/1999 Midya (Continued)

FOREIGN PATENT DOCUMENTS

CN           1443395 A       9/2003
JP         2003-533116      11/2003

(Continued)

OTHER PUBLICATIONS

International Preliminary Report on Patentability and Written Opinion of the International Searching Authority issued in International Patent Application No. PCT/JP2009/051771, mailed Sep. 16, 2010.

(Continued)

*Primary Examiner* — Adolf Berhane
*Assistant Examiner* — Lakaisha Jackson
(74) *Attorney, Agent, or Firm* — McDermott Will & Emery LLP

(57) ABSTRACT

An envelope tracking power supply circuit is a power supply circuit for generating an output voltage according to the envelope of a high frequency signal and includes a voltage follower circuit for receiving an envelope signal and outputting a voltage according to the envelope signal; two parallel resistors connected in parallel between the output of the voltage follower circuit and an output terminal; hysteresis comparators for detecting respective voltage drops in the parallel resistors and generating voltages according to the voltage drops; and switching converters for performing switching according to the respective voltages outputted from the hysteresis comparators and outputting a voltage to the output terminal.

4 Claims, 9 Drawing Sheets

(56) References Cited

U.S. PATENT DOCUMENTS

| | | | |
|---|---|---|---|
| 6,300,826 B1 | 10/2001 | Mathe et al. | |
| 6,565,001 B1* | 5/2003 | Schoenbauer | 235/451 |
| 7,808,323 B2* | 10/2010 | Takinami et al. | 330/297 |
| 8,030,995 B2* | 10/2011 | Okubo et al. | 330/127 |
| 2009/0212826 A1* | 8/2009 | Mizunaga | 327/62 |

FOREIGN PATENT DOCUMENTS

| | | |
|---|---|---|
| JP | 2007-531488 | 11/2007 |
| WO | WO 2005/096481 A1 | 10/2005 |
| WO | WO-2005096481 A1 | 10/2005 |

OTHER PUBLICATIONS

Kimball, D., et al., "High-Efficiency Envelope-Tracking W-CDMA Base-Station Amplifier Using GaN HFETs", IEEE Transactions on Microwave Theory and Techniques, Nov. 2006, pp. 3848-3856, vol. 54 No. 11, IEEE.

Wang, F., "High Efficiency Linear Envelope Tracking and Envelope Elimination and Restoration Power Amplifier for WLAN OFDM Applications", 2006, University of California San Diego.

Draxler, P., et al., "High Efficiency Envelope Tracking LDMOS Power Amplifier for W-CDMA", 2006, pp. 1534-1537, IEEE.

Asbeck, P., et al., "Next Generation High-Efficiency RF Transmitter Technology for Basestations", Extended Abstracts of the 2007 International Conference on Solid State Devices and Materials, 2007, pp. 146-147.

Office Action issued Nov. 7, 2012 in counterpart CN patent application No. 200980104386.8.

* cited by examiner (a)

(b)

(a)

(b)

ENVELOPE TRACKING POWER SUPPLY CIRCUIT AND HIGH-FREQUENCY AMPLIFIER INCLUDING ENVELOPE TRACKING POWER SUPPLY CIRCUIT

RELATED APPLICATIONS

This application is the U.S. National Phase under 35 U.S.C. §371 of International Application No. PCT/JP2009/051771, filed on Feb. 3, 2009, which in turn claims the benefit of Japanese Application No. 2008-029333, filed on Feb. 8, 2008, the disclosures of which Applications are incorporated by reference herein.

TECHNICAL FIELD

The present invention relates to an envelope tracking power supply circuit and a high-frequency amplifier including the same.

BACKGROUND ART

Recently, there have been increasing demands for higher efficiency and wider band in high-frequency amplifiers used in wireless base stations for mobile communications and the like. Known as an example of power supply circuits for increasing the efficiency of high-frequency power amplifiers is an envelope tracking power supply circuit which changes the power supply voltage applied to a high-frequency amplifier so as to follow an envelope of a wireless signal fed into the high-frequency amplifier (see the following Non Patent Literatures 1 to 4). The envelope tracking power supply circuit comprises a part including an operational amplifier which is a wideband power supply fed with a signal corresponding to an envelope of an input signal for a power amplifier and a part including a switching converter which is a narrowband power supply having an efficiency higher than that of the operational amplifier. Such an envelope tracking power supply circuit is effective when used as a power amplifier, which amplifies a signal having a higher peak power as compared with its average power, for a wireless base station in communication schemes such as WCDMA (Wideband Code Division Multiple Access) and OFDM (Orthogonal Frequency Division Multiplexing).

CITATION LIST

Non Patent Literature

Non Patent Literature 1: D. F. Kimball, et al., "High-Efficiency Envelope-Tracking W-CDMA Base-Station Amplifier Using GaN HFETs", IEEE Trans. on Microwave Theory and Techniques, vol. 54, no. 11, November 2006,
Non Patent Literature 2: F. Wang, "High Efficiency Linear Envelope Tracking and Envelope Elimination and Restoration Power Amplifier for WLAN OFDM Applications", Ph.D. Dissertation, University of California, San Diego, 2006,
Non Patent Literature 3: P. Draxler, S. Lanfranco, et al., "High Efficiency Envelope Tracking LDMOS Power Amplifier for W-CDMA", IEEE MTT-S International Microwave Symposium, pp. 1534-1537, June 2006,
Non Patent Literature 4: P. Asbeck, D. Kimball, et al., "Next Generation High-Efficiency RF Transmitter Technology for Basestations", Extended Abstracts of 2007 International Conference on Solid Sate Devices and Materials, pp. 146-147, Tsukuba, September 2007,

SUMMARY OF INVENTION

Technical Problem

However, while typical input envelope signals include widely distributed slew rates, the above-mentioned conventional envelope tracking power supply circuit is designed optimally for an average value of slew rates, whereby its efficiency decreases during many time periods deviating from the average slew rate. That is, when the slew rate of the envelope signal exceeds a slew rate to which the switching converter can respond, all the alternating current is supplied from the operational amplifier, whereby the efficiency decreases. When the slew rate of the envelope signal is lower than a slew rate to which the switching converter can respond, the efficiency decreases by the margin resulting from the fact that the switching converter is designed for the average slew rate, whereby the low efficiency is held constant no matter how low the slew rate is.

In view of such a problem, it is an object of the present invention to provide an envelope tracking power supply circuit and high-frequency amplifier which can maintain a high efficiency even for a high-frequency signal having a wideband envelope.

Solution to Problem

For solving the above-mentioned problem, the envelope tracking power supply circuit of the present invention is an envelope tracking power supply circuit for generating an output voltage according to an envelope of a high frequency signal and comprises a voltage follower circuit section for receiving an envelope signal corresponding to the envelope and outputting a voltage according to the envelope signal; first and second parallel resistors connected in parallel between the output of the voltage follower circuit and an output terminal of the output voltage; first and second hysteresis comparator sections for detecting respective voltage drops in the first and second parallel resistors and generating voltages according to the voltage drops; and first and second switching converter sections for performing switching according to the respective voltages outputted from the first and second hysteresis comparator sections and outputting a voltage to the output terminal.

Such an envelope tracking power supply circuit synthesizes a first current outputted from the voltage follower circuit section through the resistor, a second current outputted from the first switching converter section for performing switching in response to the detection of the first current by the first hysteresis comparator section, and a third current outputted from the second switching converter section for performing switching in response to the detection of the first current by the second hysteresis comparator section, and outputs thus synthesized current to the output terminal. The output terminal yields an output according to the level of the envelope signal as a consequence, while a circuit part constituted by the first hysteresis comparator section and first switching converter section and a circuit part constituted by the second hysteresis comparator section and second switching converter section can be designed such that their response characteristics to an envelope signal band differ from each other, so as to operate in a wide band while complementing each other. As a result, the overall efficiency can be kept high with respect to wideband envelope inputs.

Furthermore, the envelope tracking power supply circuit of the present invention is an envelope tracking power supply circuit for generating an output voltage according to an envelope of a high frequency signal and comprises a voltage follower circuit section for receiving an envelope signal corresponding to the envelope and outputting a voltage according to the envelope signal; at least one resistor connected between the output of the voltage follower circuit and an output terminal of the output voltage; first and second hysteresis comparator sections for detecting voltage drop in the resistor and generating voltages according to the voltage drop; and first and second switching converter sections for performing switching according to the respective voltages outputted from the first and second hysteresis comparator sections and outputting a voltage to the output terminal.

Advantageous Effects of Invention

The envelope tracking power supply circuit of the present invention can maintain a high efficiency even for a high-frequency signal having a wideband envelope.

REFERENCE SIGNS LIST

1 . . . high-frequency amplifier; 5 . . . envelope tracking power supply circuit; 7 . . . voltage follower circuit; 9a, 9b . . . hysteresis comparator; 11a, 11b . . . switching converter; 13a, 13b . . . semiconductor switch; 17a, 17b . . . inductor; 19a, 19b . . . power generator; $R_{sense}$ . . . parallel resistor

DESCRIPTION OF EMBODIMENTS

In the following, preferred embodiments of the high-frequency amplifier of the present invention will be explained in detail with reference to the drawings. In the explanation of the drawings, the same or equivalent parts will be referred to with the same signs while omitting their overlapping descriptions.

First Embodiment

Figure 1:
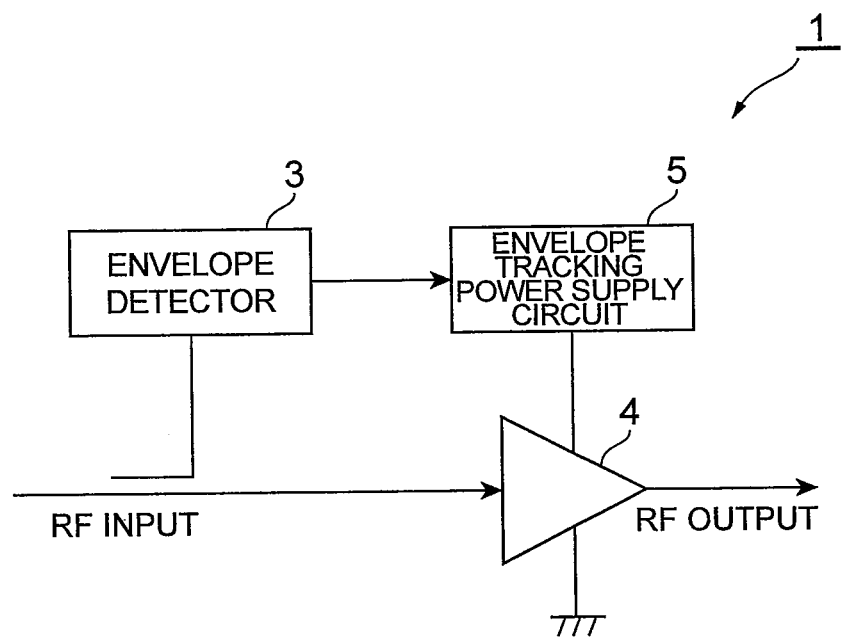
FIG. 1 is a circuit diagram illustrating a schematic structure of a high-frequency amplifier in accordance with a preferred embodiment of the present invention.

FIG. 1 is a circuit diagram illustrating a schematic structure of a high-frequency amplifier 1 in accordance with a preferred embodiment of the present invention. The high-frequency amplifier 1 illustrated in this diagram, which is used for amplifying a wireless signal in a wireless base station for mobile communications, is constituted by an envelope detector 3, an envelope tracking power supply circuit 5, and a power amplifier 4.

Figure 2:
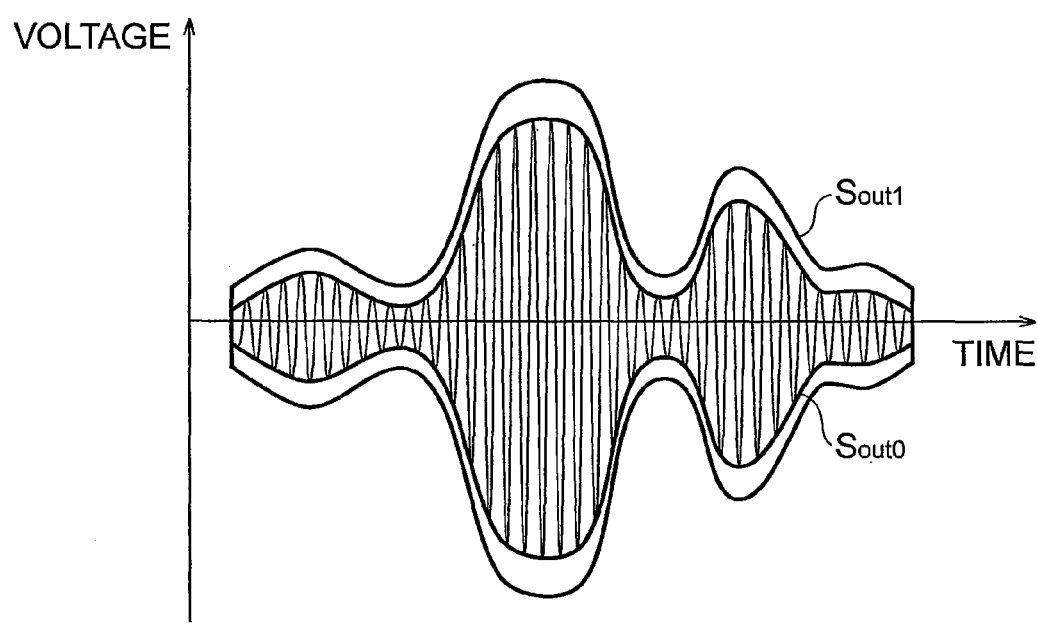
FIG. 2 is a graph illustrating changes with time of the voltage of an output RF signal of the power amplifier and the output voltage of the envelope tracking power supply circuit in FIG. 1.

The power amplifier 4 receives a power supplied from the envelope tracking power supply circuit 5, amplifies an inputted high-frequency wireless signal (hereinafter referred to as RF signal), and outputs thus amplified signal. The envelope detector 3 finds an envelope by detection or the like and feeds an envelope signal into the envelope tracking power supply circuit 5. FIG. 2 illustrates an example of changes with time of a voltage $S_{out0}$ of an output RF signal of the power amplifier 4 and an output voltage $S_{out1}$ of the envelope tracking power supply circuit 5. Thus, the envelope tracking power supply circuit 5 generates the output voltage according to the change with time of the envelope of the RF signal. This makes it possible to reduce the total power consumption as compared with the case where a fixed-voltage power supply circuit is connected to the power amplifier 4.

Figure 3:
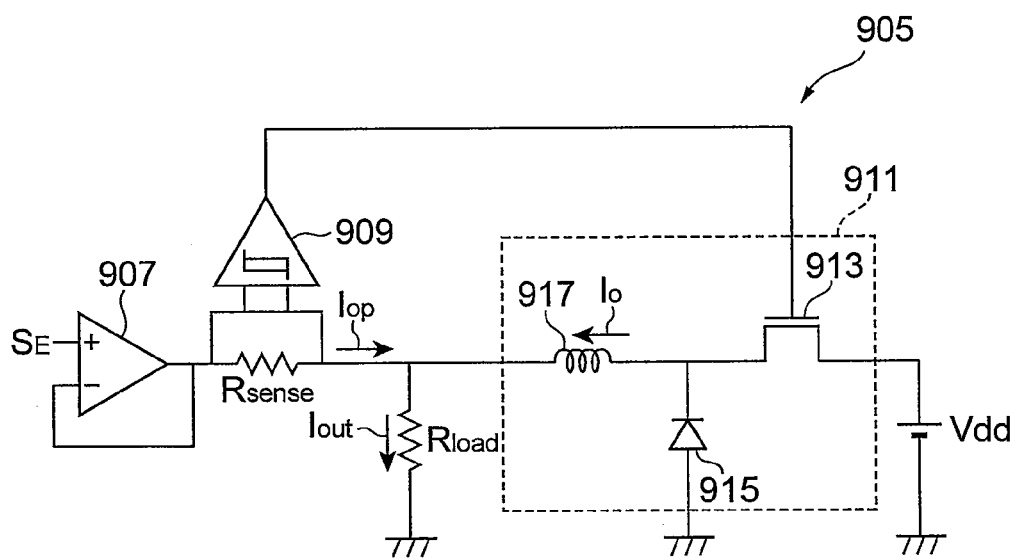
FIG. 3 is a basic circuit diagram for explaining an envelope tracking scheme.

In the following, before explaining the envelope tracking power supply circuit 5 in accordance with this embodiment, a principle of an envelope tracking scheme will be explained. FIG. 3 is a basic circuit diagram for explaining the principle of the envelope tracking scheme.

A basic circuit 905 of the envelope tracking scheme is constituted by a voltage follower circuit 907 made of an operational amplifier adapted to receive an envelope signal $S_E$, a resistor element $R_{sense}$ connected between the voltage follower circuit 907 and an output of the basic circuit 905, a hysteresis comparator 909 which detects a voltage drop in the resistor element $R_{sense}$ and compares potentials at its both ends, and a switching converter 911 which receives an output of the hysteresis comparator 909 and performs switching. The switching converter 911 is constituted by a semiconductor switch 913 such as a power MOSFET having a drain terminal to which a bias voltage $V_{dd}$ is applied and a gate terminal to which the output of the hysteresis comparator 909 is connected, a diode 915 having an anode terminal grounded and a cathode terminal connected to a source terminal of the semiconductor switch 913, and an inductor 917 connected between the source terminal of the semiconductor switch 913 and the output of the basic circuit 905. In this diagram, the power amplifier 4 is equivalently replaced by a load resistor $R_{load}$.

Such basic circuit 905 synthesizes the current supplied from the voltage follower circuit 907 to the load resistor $R_{load}$ and the current supplied from the switching converter 911 to the load resistor $R_{load}$, so as to generate an output voltage corresponding to the envelope signal $S_E$ in the load resistor $R_{load}$ and output this voltage.

Specifically, when the output voltage of the hysteresis comparator 909 is high while the semiconductor switch 913 is on, the current from the switching converter 911 increases, with which the current from the voltage follower circuit 907 into the load resistor $R_{load}$ decreases. As a result, the voltage drop in the resistor element $R_{sense}$ decreases, so that the output of the hysteresis comparator 909 becomes low, thereby turning the semiconductor switch 913 off. When the semiconductor switch 913 is off, the current from the switching converter 911 decreases, with which the current flowing from the voltage follower circuit 907 into the load resistor $R_{load}$ increases. As a result, the voltage drop in the resistor element $R_{sense}$ increases, so that the output of the hysteresis comparator 909 becomes high, thereby turning the semiconductor switch 913 on.

Figure 4:
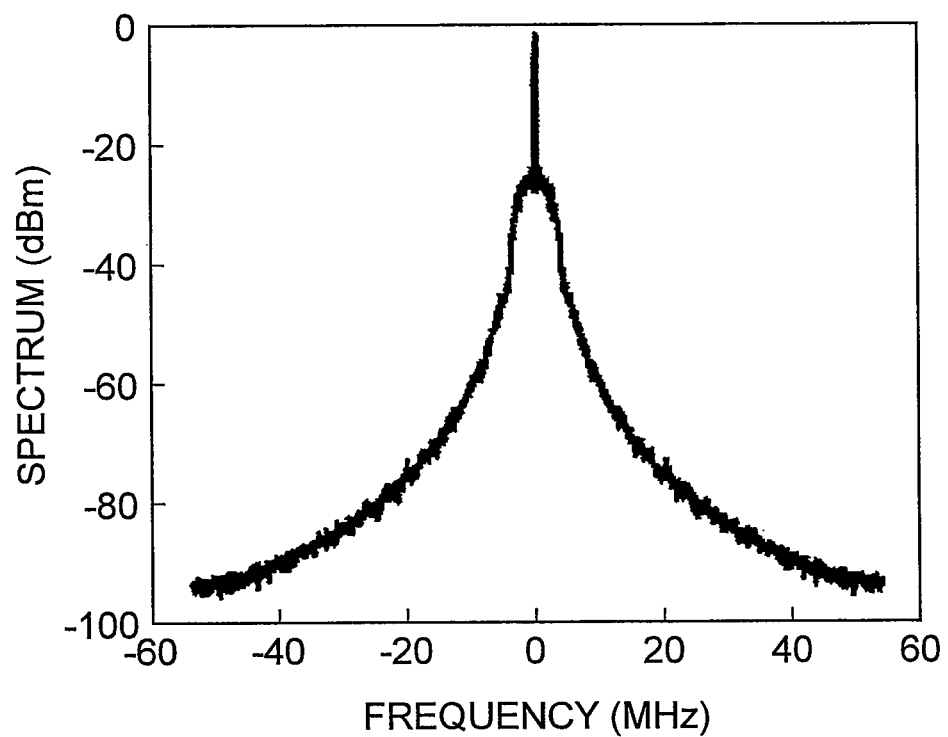
FIG. 4 is a graph illustrating a spectral distribution of an envelope signal in a mobile communication scheme of WCDMA.

Repeating the foregoing operations allows the output voltage of the voltage follower circuit 907 to complement (cancel) high-frequency components (ripples) of the output voltage in the switching converter 911, thereby generating the output voltage corresponding to the envelope signal $S_E$ in the load resistor $R_{load}$. At this time, the voltage follower circuit 907 made of an operational amplifier is a wideband power supply with a low efficiency, while the switching converter 911 is a narrowband power supply with a high efficiency. Here, as illustrated in FIG. 4, the spectral distribution of the envelope signal in the mobile communication scheme of WCDMA is concentrated in a low frequency band including a DC component. Therefore, the high-efficiency switching converter 911 supplies a power to the DC component and low-frequency component of the envelope, while the wideband voltage follower circuit 907 supplies a power to the high-frequency component of the envelope, whereby the whole power supply circuit maintains an efficiency.

Operations of the basic circuit 905 will now be explained in more details with reference to signal waveforms outputted from the individual circuit sections. Let L be the inductance of the inductor 917 in the basic circuit 905, and h be the hysteresis width of the hysteresis comparator 909.

Figure 5:
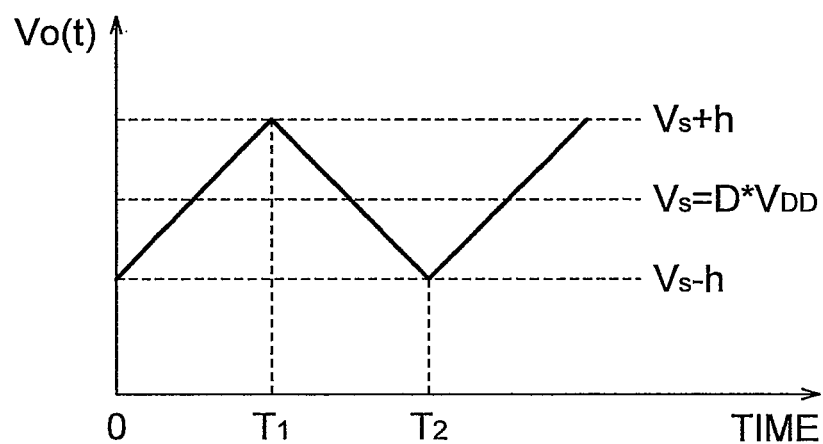
FIG. 5 (a) is a graph illustrating the change with time of the output voltage from the switching converter of FIG. 3, while (b) is a graph illustrating the change with time of the output current from the switching converter of FIG. 3.
Figure 5:
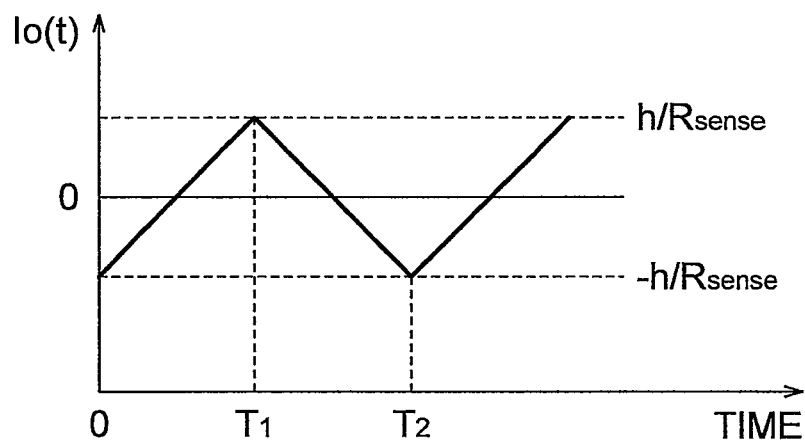

FIG. 5 schematically illustrates (a) the output voltage $V_O(t)$ from the switching converter 911 and (b) the output current $I_O(t)$ from the switching converter 911. Here, D in FIG. 5(a) is a duty ratio and indicates a value obtained by dividing the DC component of the envelope signal by the power supply voltage $V_{dd}$. Thus, the output current $I_O$ begins to increase when the semiconductor switch 913 is turned on at time t=0, and the output of the hysteresis comparator 909 is inverted when the output current $I_O$ reaches an upper limit value $h/R_{sense}$ determined by the hysteresis width h of the hysteresis comparator 909, whereby the semiconductor switch 913 is turned off (time $t=T_1$). The output current $I_O$ from the switching converter 911 begins to decrease when the semiconductor switch 913 is turned off, and the output of the hysteresis comparator 909 is inverted when the output current $I_O$ reaches a lower limit value $-h/R_{sense}$ determined by the hysteresis width h of the hysteresis comparator 909, whereby the semiconductor switch 913 is turned on (time $t=T_2$).

Figure 6:
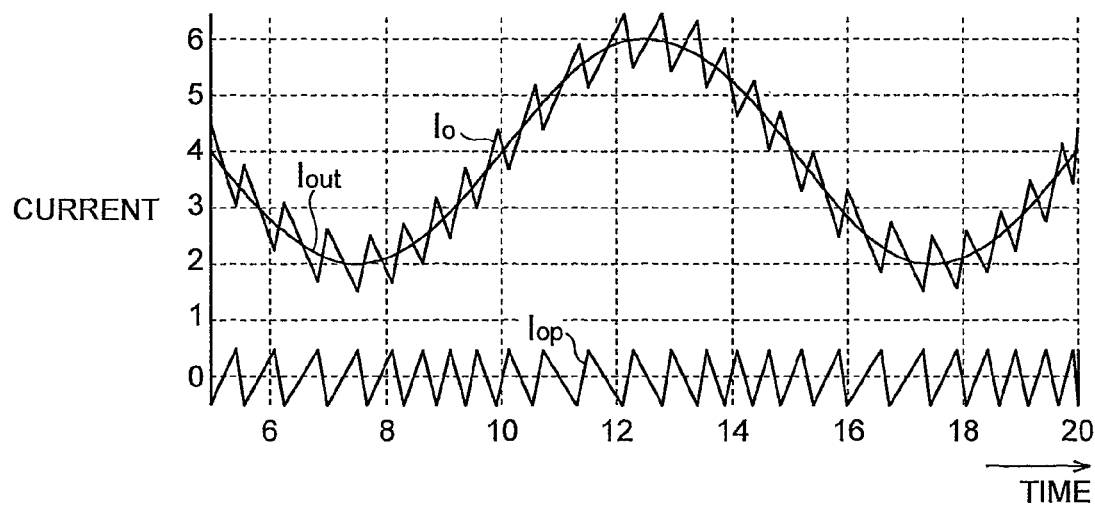
FIG. 6 is a graph illustrating input and output waveforms in the basic circuit of FIG. 3.
Figure 6:
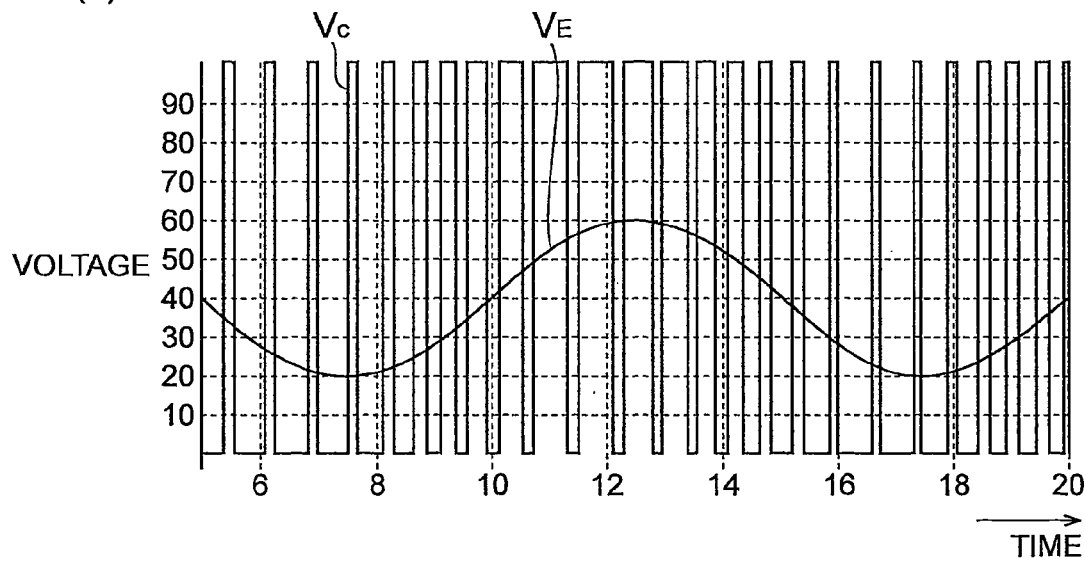

FIG. 6 illustrates measurement results of changes with time of the voltage $V_E$ of the envelope signal $S_E$, the output current $I_{OP}$ from the voltage follower circuit 907, the output voltage $V_C$ from the hysteresis comparator 909, the output current $I_O$ of the switching converter 911, and the output current $I_{out}$ to the load resistor $R_{load}$ in the basic circuit 905. Thus, while the basic circuit 905 generates internal oscillation, the output current $I_{out}$ is free from ripples. The switching frequency of the switching converter 911 at this time is determined by and inversely proportional to both of the inductance L and hysteresis width h.

Figure 7:
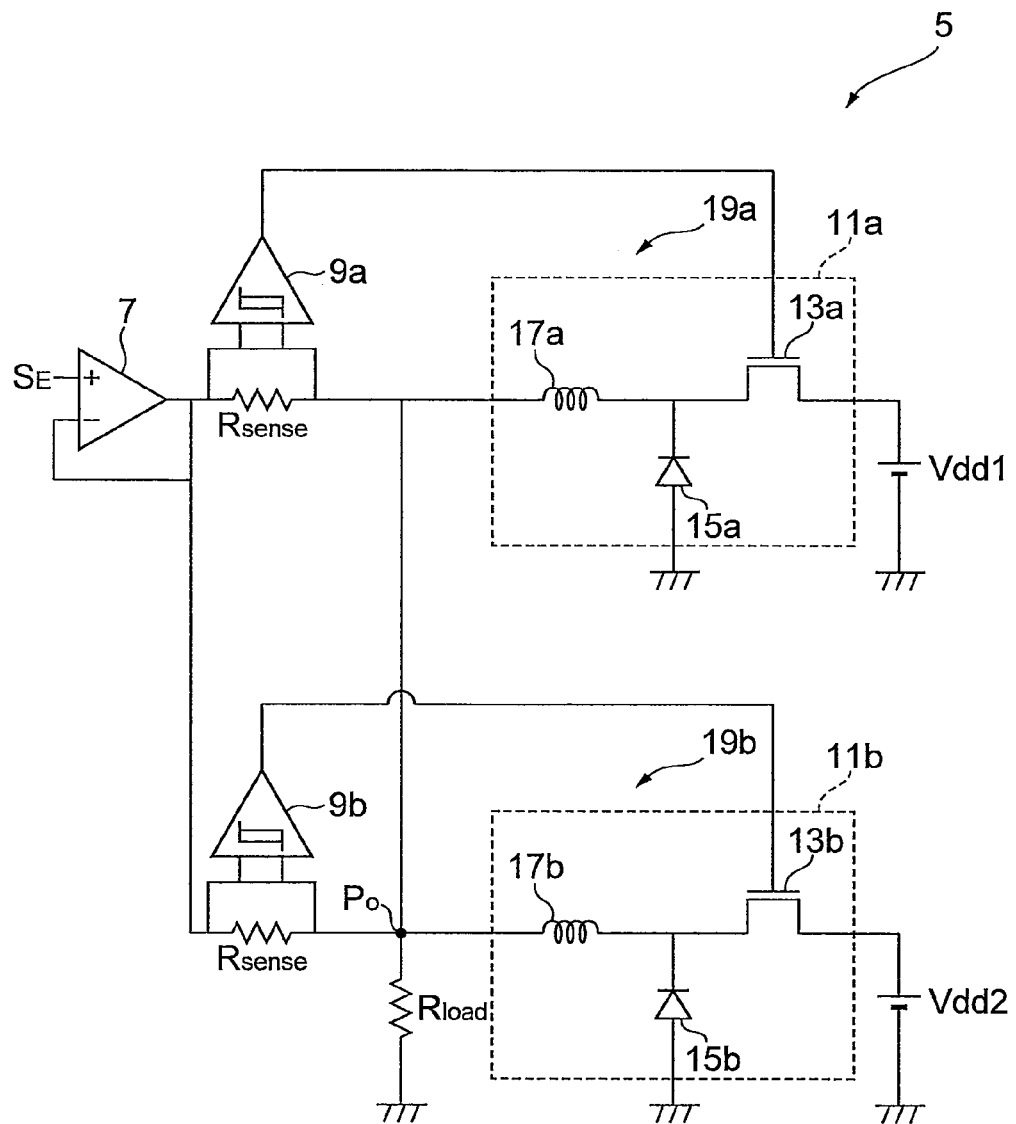
FIG. 7 is a circuit diagram illustrating the structure of the envelope tracking power supply circuit of FIG. 1.

The structure of the envelope tracking power supply circuit 5 in accordance with this embodiment will now be explained. FIG. 7 is a circuit diagram illustrating the structure of the envelope tracking power supply circuit 5.

As illustrated in this diagram, the envelope tracking power supply circuit 5 has two systems of circuits each including a hysteresis comparator and a switching converter. Specifically, the envelope tracking power supply circuit 5 comprises a voltage follower circuit 7 for outputting a voltage according to the voltage $V_E$ of the envelope signal $S_E$, two parallel resistors $R_{sense}$ connected between the output of the voltage follower circuit 7 and an output terminal $P_O$ connected to the load resistors $R_{sense}$, and two systems of power generators 19a, 19b provided so as to correspond to the two parallel resistors $R_{sense}$, respectively.

The power generator 19a is constituted by a hysteresis comparator 9a and a switching converter 11a. The hysteresis comparator 9a has input terminals connected to both ends of one parallel resistor $R_{sense}$, detects a voltage drop in the parallel resistor $R_{sense}$, and generates a voltage in a high or low state according to the voltage drop. The hysteresis comparator 9a has a hysteresis width set to $h_1$.

The switching converter 11a is a power supply circuit which outputs a voltage to the output terminal $P_O$ when driven to perform switching according to the voltage outputted by the hysteresis comparator 9a. The switching converter 11a is constituted by a semiconductor switch 13a such as a power MOSFET having a drain terminal to which a bias voltage $V_{dd1}$ is applied and a gate terminal to which the output of the hysteresis comparator 9a is connected, a diode 15a having an anode terminal grounded and a cathode terminal connected to a source terminal of the semiconductor switch 13a, and an inductor 17a connected between the source terminal of the semiconductor switch 13a and the output terminal $P_O$. The semiconductor switch 13a turns on/off according to the output voltage of the hysteresis comparator 9a, while the inductor 17a functions to receive the current flowing through the semiconductor switch 13a and inhibits the current from changing. The inductance of the inductor 17a is set to $L_1$.

The power generator 19b, which has a structure similar to that of the power generator 19a, comprises a hysteresis comparator 9b connected to both ends of the other parallel resistor $R_{sense}$ and a switching converter 11b driven to perform switching by the hysteresis comparator 9b. The switching converter 11b is constituted by a semiconductor switch 13b having a drain terminal to which a bias voltage $V_{dd2}$ is applied and a gate terminal to which the output of the hysteresis comparator 9b is connected, a diode 15b having an anode terminal grounded and a cathode terminal connected to a source terminal of the semiconductor switch 13b, and an inductor 17b connected between the source terminal of the semiconductor switch 13b and the output terminal $P_O$. The hysteresis comparator 9b has a hysteresis width $h_2$ set to a value smaller than the hysteresis width $h_1$ of the hysteresis comparator 9a, while the inductor 17b has an inductance $L_2$ set to a value greater than the inductance $L_1$ of the inductor 17a.

Operations and effects of the high-frequency amplifier 1 in accordance with this embodiment will now be explained as compared with the case using the basic circuit 905.

When using the basic circuit 905, the inductance L and hysteresis width h are considered to be parameters adjustable at the time of designing the circuit. Here, since the efficiency becomes better as the current to the load resistor $R_{load}$ is supplied more from the switching converter, a wider band can be secured as the inductance L is made smaller. However, as the inductance L is made smaller, the switching frequency rises and may exceed the upper limit value in the switching converter. When the hysteresis width h is made greater in response to the value of L, on the other hand, the current supplied from the voltage follower circuit increases, thereby lowering the efficiency. Hence, a trade-off is seen between the efficiency of the whole circuit and the bandwidth.

Therefore in the case using the basic circuit 905, by utilizing the condition that the efficiency is the highest when the average slew rate of the envelope signal $S_E$ and the slew rate of the switching converter coincide with each other, the optimal value of inductance L is determined according to the following expression (1):

[Math. 1]

$$L_{match} = \frac{2(1-D)V_{S\_dc} \cdot R_{load}}{|\Delta V_S(t)/\Delta t|} \quad (1)$$

where $V_{s\_dc}$ denotes the DC component of the envelope signal $S_E$, D indicates the average duty ratio calculated by $V_{s\_dc}/V_{dd}$, and the denominator is the averaged change with time of the envelope signal $S_E$. The switching frequency at this time is represented by the following expression (2):

[Math. 2]

$$f_{sw} = \frac{R_{sense}}{L} \cdot \frac{V_{dd}}{2h} \cdot D \cdot \left(1 - D \cdot \frac{V_{s\_rms}^2}{V_{s\_dc}^2}\right) \quad (2)$$

where $V_{s\_rms}$ is the root mean square of the envelope signal $S_E$. Here, all the items other than the hysteresis width h have been known, whereby the optimal value of hysteresis width h can be determined when the switching frequency is defined.

Even when the hysteresis width h and inductance L are designed by using a designing technique such as the one mentioned above, the envelope signal $S_E$ includes widely distributed slew rates (see FIG. 4), whereas the basic circuit 905 is optimized for only the average slew rate, whereby the efficiency decreases greatly during many time periods deviating from the average slew rate. When the slew rate of the envelope signal $S_E$ is lower than that of the switching converter, on the other hand, the efficiency decreases by the margin resulting from the fact that the inductance L is made smaller in order to attain a wider band, whereby the low efficiency is held constant no matter how low the input slew rate is.

In the envelope tracking power supply circuit 5 of this embodiment, by contrast, the power generator 19a constituted by the hysteresis comparator 9a and switching converter 11a and the power generator 19b constituted by the hysteresis comparator 9b and switching converter 11b are designed such as to have different response characteristics for the band of the envelope signal $S_E$, whereby the two power generators 19a, 19b can operate in a wide band while complementing each other. As a result, the overall efficiency can be kept high with respect to wideband envelope inputs.

That is, the inductance $L_1$ of the power generator 19a is smaller than the inductance $L_2$ of the power generator 19b, while the hysteresis width $h_1$ of the power generator 19a is greater than the hysteresis width $h_2$ of the power generator 19b. As a consequence, the power generator 19a can operate as a power supply with a low efficiency in a wide band, while the power generator 19b can operate as a power supply with a high efficiency in a narrow band, and their switching frequencies can be made closer to each other.

Figure 8:
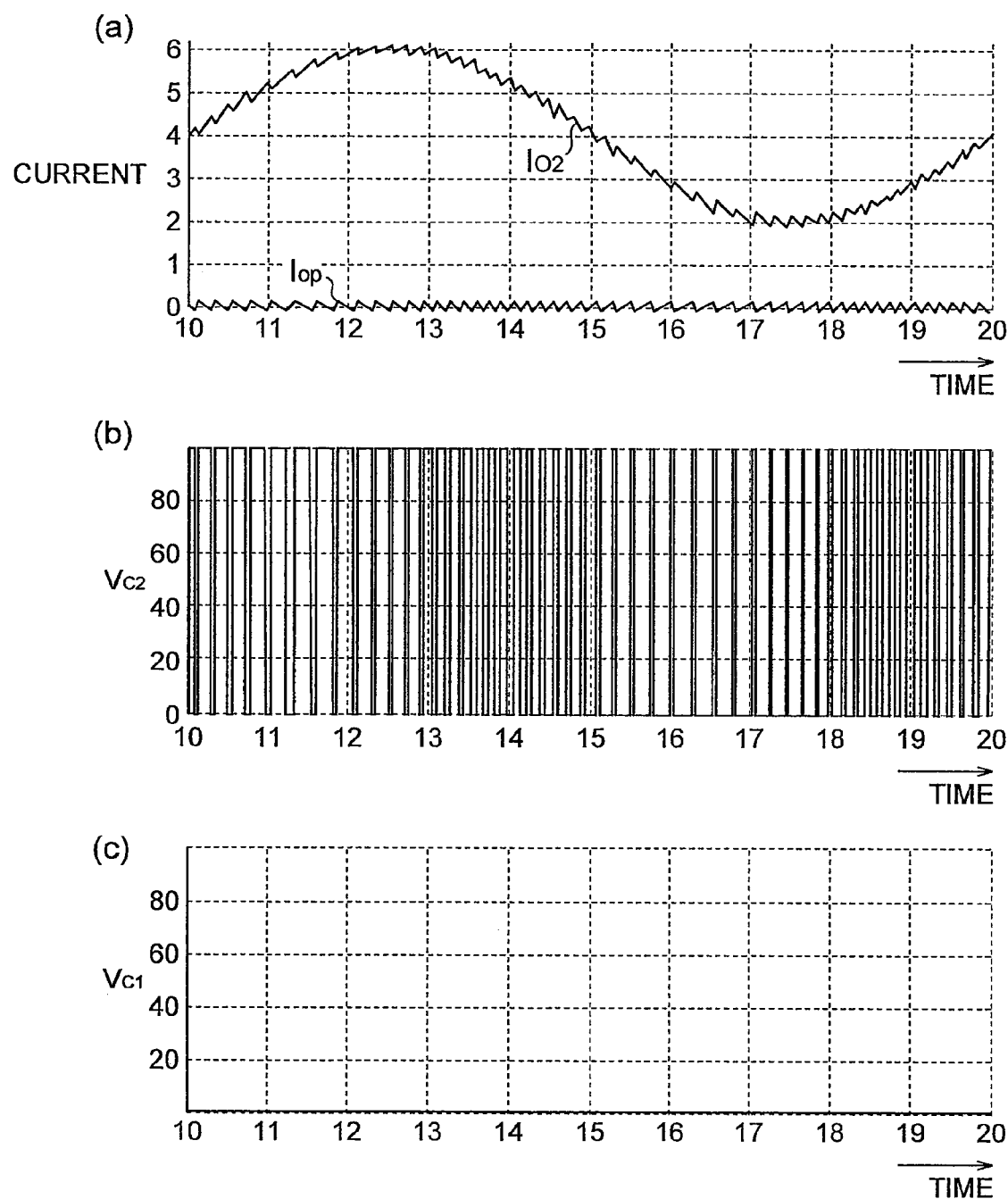
FIG. 8 is a graph illustrating output waveforms in the envelope tracking power supply circuit of FIG. 7.

FIG. 8 is a chart illustrating measurement results of output waveforms in the envelope tracking power supply circuit 5 when the slew rate of the envelope signal $S_E$ is low, in which $I_{OP}$ is the output current from the voltage follower circuit 7, $V_{C1}$ and $V_{C2}$ are respective output voltages from the hysteresis comparators 9a, 9b, and $I_{O1}$ and $I_{O2}$ are respective output currents of the switching converters 11a, 11b. Thus, the narrowband/high-efficiency power generator 19b having a higher inductance and a smaller hysteresis width is seen to be switched to operate alone after a lapse of time from starting.

Here, the wideband/low-efficiency power generator 19a having a smaller inductance and a greater hysteresis width stops operating.

Figure 9:
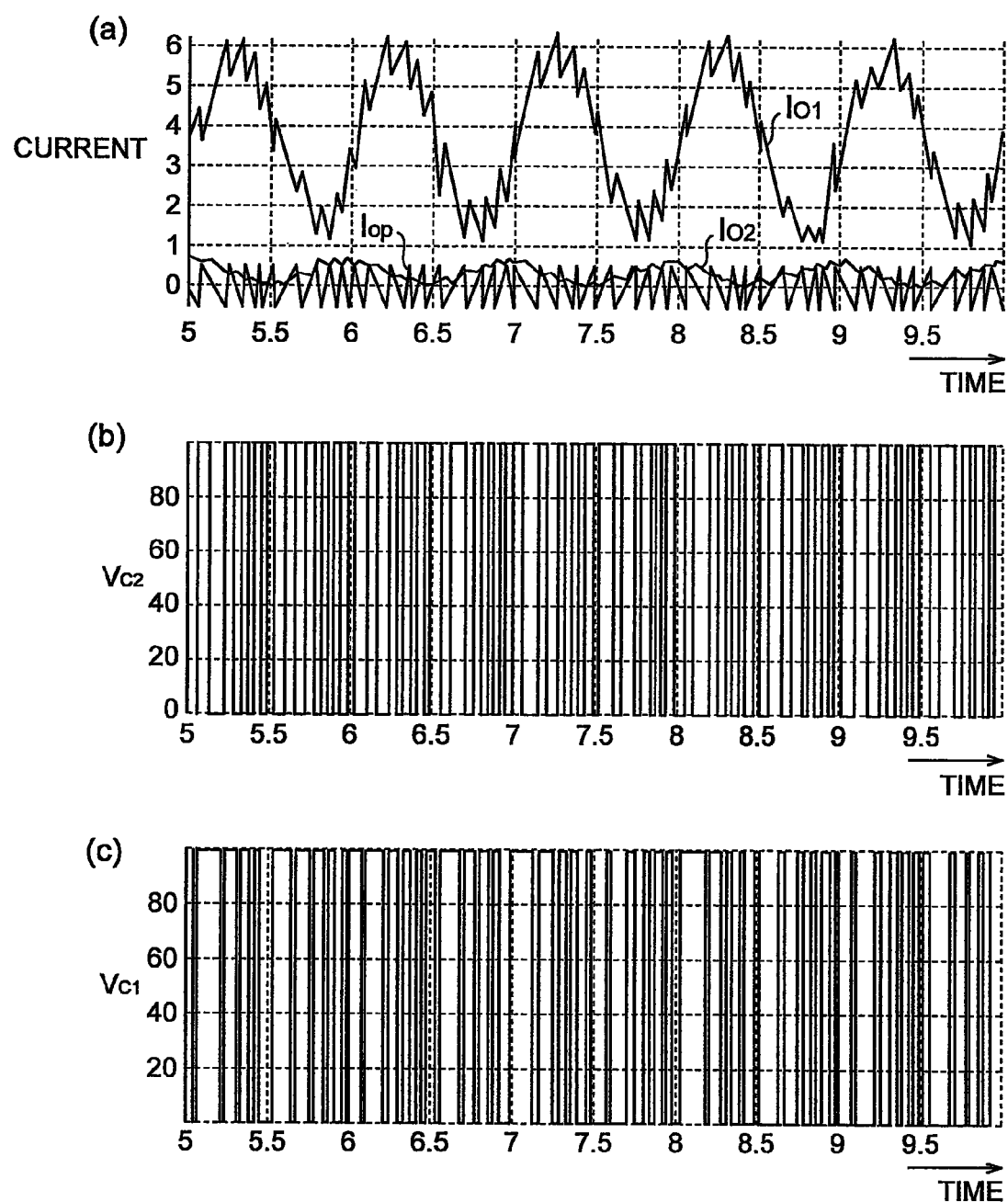
FIG. 9 is a graph illustrating output waveforms in the envelope tracking power supply circuit of FIG. 7.

FIG. 9 is a chart illustrating measurement results of output waveforms in the envelope tracking power supply circuit 5 when the slew rate of the envelope signal $S_E$ is high. Though both the power generators 19a, 19b operate in this case, the power generator 19a having a smaller inductance and a greater hysteresis width yields a greater current.

As can be seen from these measurement results, the narrowband/high-efficiency switching converter is switched to operate when the input slew rate is low, while the wideband switching converter operates when the input slew rate is high, so that the current from the voltage follower circuit having the lowest efficiency can be prevented from increasing, whereby the efficiency can be improved greatly as compared with the basic circuit 905 yielding a fixed low efficiency regardless of the input slew rate.

The present invention is not limited to the above-mentioned embodiment. For example, though the envelope tracking power supply circuit 5 of the above-mentioned embodiment comprises two systems of power generators 19a, 19b, three or more systems of power generators whose inductances and hysteresis widths are changed in multiple stages may be provided.

While the power generators 19a, 19b of this embodiment may be set to various inductances and hysteresis widths as long as the inductance $L_1$ is smaller than the inductance $L_2$ while the hysteresis width $h_1$ is greater than the hysteresis width $h_2$, from the viewpoint of making switching frequencies closer to each other so as to employ the same device for the semiconductor switches 13a, 13b and the like and facilitate the designing, it will be preferred if they are set such as to yield substantially the same product of inductance L and hysteresis width h.

Preferably, the first and second switching converter sections have first and second switches adapted to turn on/off according to the voltages outputted from the first and second hysteresis comparator sections and first and second inductors for receiving currents flowing through the first and second switches, respectively, while the first inductor has an inductance smaller than that of the second inductor.

In this case, while the first switching converter section has a wider band for responding to the envelope, the second switching converter section has a narrower band for responding to the envelope but yields an efficiency higher than that of the first switching converter section. As a result, in response to the slew rate of the envelope, the first and second switching converter sections supply an output current while complementing each other, so that the output current from the voltage follower circuit section is prevented from increasing, whereby the overall efficiency can be kept high with respect to wideband envelope inputs.

Preferably, the first hysteresis comparator section has a hysteresis width greater than that of the second hysteresis comparator section.

When such a structure is employed, the first switching converter section adapted to operate when the slew rate of the envelope is high and the second switching converter section adapted to operate when the slew rate of the envelope is low can have respective switching frequencies closer to each other, whereby circuit elements constituting switching converters can be used in common, so as to make it easier to design the circuit.

In another aspect, the high-frequency amplifier of the present invention comprises the above-mentioned envelope tracking power supply circuit and an amplifier for receiving the output voltage supplied from the output terminal of the envelope tracking power supply circuit and amplifying the high frequency signal. Such a high-frequency amplifier can keep the overall efficiency high with respect to high frequency signal inputs having wideband envelopes.

INDUSTRIAL APPLICABILITY

The present invention is for use in an envelope tracking power supply circuit and a high-frequency amplifier including the same and maintains a high efficiency even for a high-frequency signal having a wideband envelope.

The invention claimed is:

1. An envelope tracking power supply circuit for generating an output voltage according to an envelope of a high frequency signal, the envelope tracking power supply circuit comprising:
    a voltage follower circuit for receiving an envelope signal corresponding to the envelope and outputting a voltage according to the envelope signal;
    first and second parallel resistors connected in parallel between an output of the voltage follower circuit and an output terminal of the output voltage;
    first and second hysteresis comparators for detecting respective voltage drops in the first and second parallel resistors and generating voltages according to the voltage drops; and
    first and second switching convertors for performing switching according to the respective voltages outputted from the first and second hysteresis comparators and outputting a voltage to the output terminal.

2. The envelope tracking power supply circuit according to claim 1,
    wherein the first and second switching converters have first and second switches configured to turn on/off according to the voltages outputted from the first and second hysteresis comparators and first and second inductors for receiving currents flowing through the first and second switches, respectively; and
    wherein the first inductor has an inductance smaller than that of the second inductor.

3. The envelope tracking power supply circuit according to claim 2, wherein the first hysteresis comparator has a hysteresis width greater than that of the second hysteresis comparator.

4. A high-frequency amplifier comprising:
    the envelope tracking power supply circuit according to claim 1; and
    an amplifier for receiving the output voltage supplied from the output terminal of the envelope tracking power supply circuit and amplifying the high frequency signal.

* * * * *